(12) United States Patent
Schahl et al.

(10) Patent No.: US 7,239,973 B2
(45) Date of Patent: Jul. 3, 2007

(54) METHOD AND TEST ADAPTER FOR TESTING AN APPLIANCE HAVING A SMART CARD READER

(75) Inventors: Christian Schahl, St. Sulpice la Forêt (FR); Jean-Pierre Bertin, Guemene-Penfao (FR); Claude Rambault, St. Sulpice la Forêt (FR); Jean-Michel Boulben, St. Jean sur Couesnon (FR)

(73) Assignee: Thomson Licensing, Boulogne-Billancourt (FR)

( * ) Notice: Subject to any disclaimer, the term of this patent is extended or adjusted under 35 U.S.C. 154(b) by 98 days.

(21) Appl. No.: 10/521,485

(22) PCT Filed: Jul. 5, 2003

(86) PCT No.: PCT/EP03/07209

§ 371 (c)(1),
(2), (4) Date: Jan. 19, 2005

(87) PCT Pub. No.: WO2004/010156

PCT Pub. Date: Jan. 29, 2004

(65) Prior Publication Data

US 2005/0261861 A1 Nov. 24, 2005

(30) Foreign Application Priority Data

Jul. 19, 2002 (EP) ................................. 02291832

(51) Int. Cl.
*G06F 19/00* (2006.01)

(52) U.S. Cl. ...................... 702/122; 702/115; 235/492; 700/11; 713/182; 713/193

(58) Field of Classification Search ................ 702/115, 702/122; 700/11; 713/182, 193; 235/375, 235/440, 451, 487, 492
See application file for complete search history.

(56) References Cited

U.S. PATENT DOCUMENTS 6,669,096 B1 * 12/2003 Saphar et al. ............... 235/492

(Continued)

FOREIGN PATENT DOCUMENTS

DE      19542262      5/1996

(Continued)

OTHER PUBLICATIONS

Search Report Dated Nov. 25, 2003.

*Primary Examiner*—Carol S. W. Tsai
(74) *Attorney, Agent, or Firm*—Joseph J. Laks; Robert Shedd; Paul P. Kiel

(57) ABSTRACT

For testing of the appliance, a test adapter is used as an interface, which is inserted into the smart card reader of the appliance. Advantageously, a contact of the smart card reader is used for testing of the appliance, which is not used by the appliance, when operating with a smart card. One of the contacts used for testing of the appliance is in particularly the contact for the programming voltage VPP according to the ISO/IEC 7816-3:1997(E) standard. In a preferred embodiment, the test adapter comprises a serial adapter interface to a RS232 plug, which is coupled to a computer for testing of the appliance. This allows to use the XON/XOFF protocol via two data lines for testing of the appliance. The electronics part of the test adapter is powered via the smart card reader interface, when the test adapter is inserted into the smart card reader of the appliance. The appliance is especially a set-top box or a digital satellite receiver.

10 Claims, 3 Drawing Sheets

U.S. PATENT DOCUMENTS

Figure 1:
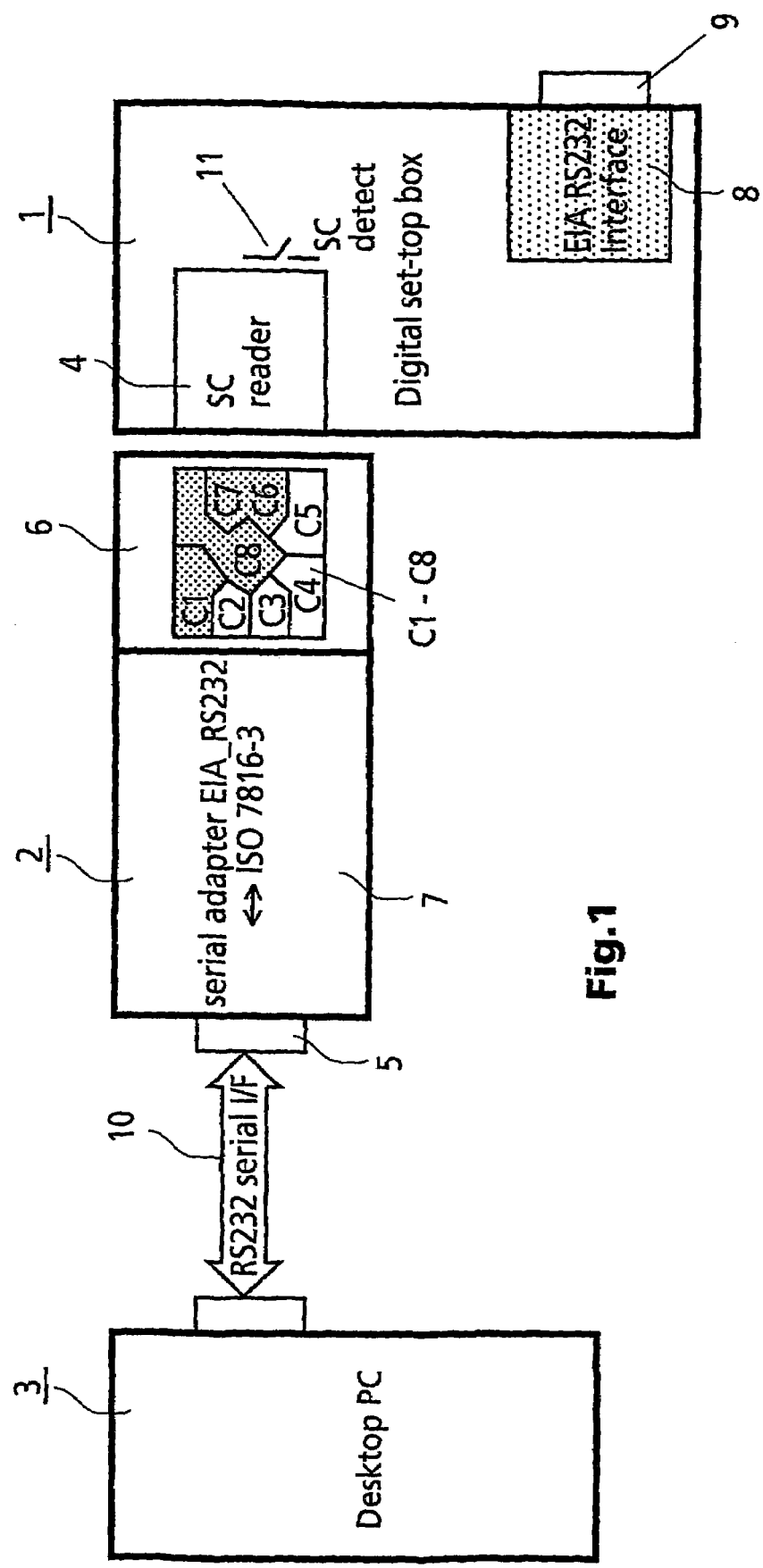

| | | | |
|---|---|---|---|
| 6,882,729 B2 * | 4/2005 | Arling et al. | 380/274 |
| 2003/0041188 A1 * | 2/2003 | Han et al. | 710/11 |
| 2003/0066893 A1 * | 4/2003 | Yap et al. | 235/487 |
| 2004/0148118 A1 * | 7/2004 | Will et al. | 702/115 |
| 2004/0249625 A1 * | 12/2004 | Learning | 703/27 |
| 2005/0096753 A1 * | 5/2005 | Arling et al. | 700/11 |
| 2005/0195979 A1 * | 9/2005 | Arling et al. | 380/274 |

FOREIGN PATENT DOCUMENTS

| | | | |
|---|---|---|---|
| EP | 1575293 A1 * | 9/2005 | |
| FR | 2808100 | 10/2001 | |
| WO | WO 01/37200 | 5/2001 | |

* cited by examiner

METHOD AND TEST ADAPTER FOR TESTING AN APPLIANCE HAVING A SMART CARD READER

This application claims the benefit, under 35 U.S.C. § 365 of International Application PCT/EP2003/007209, filed Jul. 5, 2003, which was published in accordance with PCT Article 21(2) on Jan. 29, 2004 in English and which claims the benefit of European patent application No. 02291832.0, filed Jul. 19, 2002.

The invention relates to a method for testing an appliance having a smart card reader for operation with a smart card, and a respective appliance. Appliances of this kind are known for example from pay television broadcast (Pay TV), electronic payment, or banking services.

Smart cards, also known as IC cards, are portable information media, having the size of about a credit card. They comprise an integrated card controller, or at least an integrated memory, for a data exchange with a respective appliance. A portable device of this kind is known for example from EP-A-0 633 544. As a general term for this data media the expression "smart card" will be used throughout in this description. Usually, smart cards are provided with contacts being mechanically contacted by a smart card reader for an electrical connection, for a data exchange with the respective appliance, but smart cards with wireless contact means, having no direct mechanical contact connection, are known also.

The communication between smart cards and respective appliances is described for example in WO 97/25685 and EP-A-0 814 427. An international standard, which describes and defines smart cards having contacts and the operation procedures of smart cards, is ISO/IEC 7816-3:1997(E). This standard is used particularly for pay television systems, which use a set-top box, or a digital satellite receiver, with a smart card reader and respective smart cards for authorizing the reception of pay television broadcasts. The respective smart cards comprise data, which enable the set-top box to unscramble received coded video signals.

It is known to provide digital set-top boxes with a so-called. FFT interface for allowing Factory Functional Tests (FFT). This is a tool, which gives the capability to drive the set-top box hardware through its low level drivers, by using an external computer, for example a PC. The computer is coupled via a standard EIA-RS232 communication port to the set-top box, the set-top box comprising a respective port for example at the rear side. This test method uses a FFT commands library, which is common to all the respective appliances. The main idea of this tool is to provide easy access during the factory process, especially for the consumer test after production of the appliance, when the box is closed. This feature is also very useful for after-sales diagnostics or development diagnostics too.

It is an object of the invention to provide a method for testing of an appliance having a smart card reader for operation with a smart card, which allows to reduce the costs for the appliance, and a respective appliance.

This object is achieved for a method as specified in claim 1. Further, a respective test adapter is specified in claim 5 and a respective appliance in claim 7. Advantageous developments of the invention are specified in the subclaims.

According to the invention, a test adapter is used as an interface, which is inserted into the smart card reader of the appliance for testing of the appliance. Advantageously, a contact of the smart card reader is used for testing of the appliance, which is not used by the appliance, when operating with a smart card. One of the contacts used for testing of the appliance is in particularly the smart card contact for the programming voltage VPP according to the ISO/IEC 7816-3:1997(E).

In a preferred embodiment, the test adapter comprises a serial interface to a RS232 plug, which is coupled to a computer for testing of the appliance. The test adapter comprises the respective hardware to convert the signals according to the smart card standard into the RS232 standard. This allows especially to use the XON/XOFF protocol via two data lines for testing of the appliance.

The electronics part on the test adapter is powered via the smart card reader interface, when the test adapter is inserted into the smart card reader of the appliance. Only four contacts are necessary for testing of the appliance: Two contacts for the power connection, one line for transmitting signals, and one line for receiving signals. For the receiving signals, the already available IN/OUT contact of the smart card reader can be used.

With this method, the often used RS232 connector with the respective interface in the appliance, a set-top box or a digital satellite receiver, can be avoided. Only a few modifications of the electrical layout inside the appliance are necessary.

Figure 2:
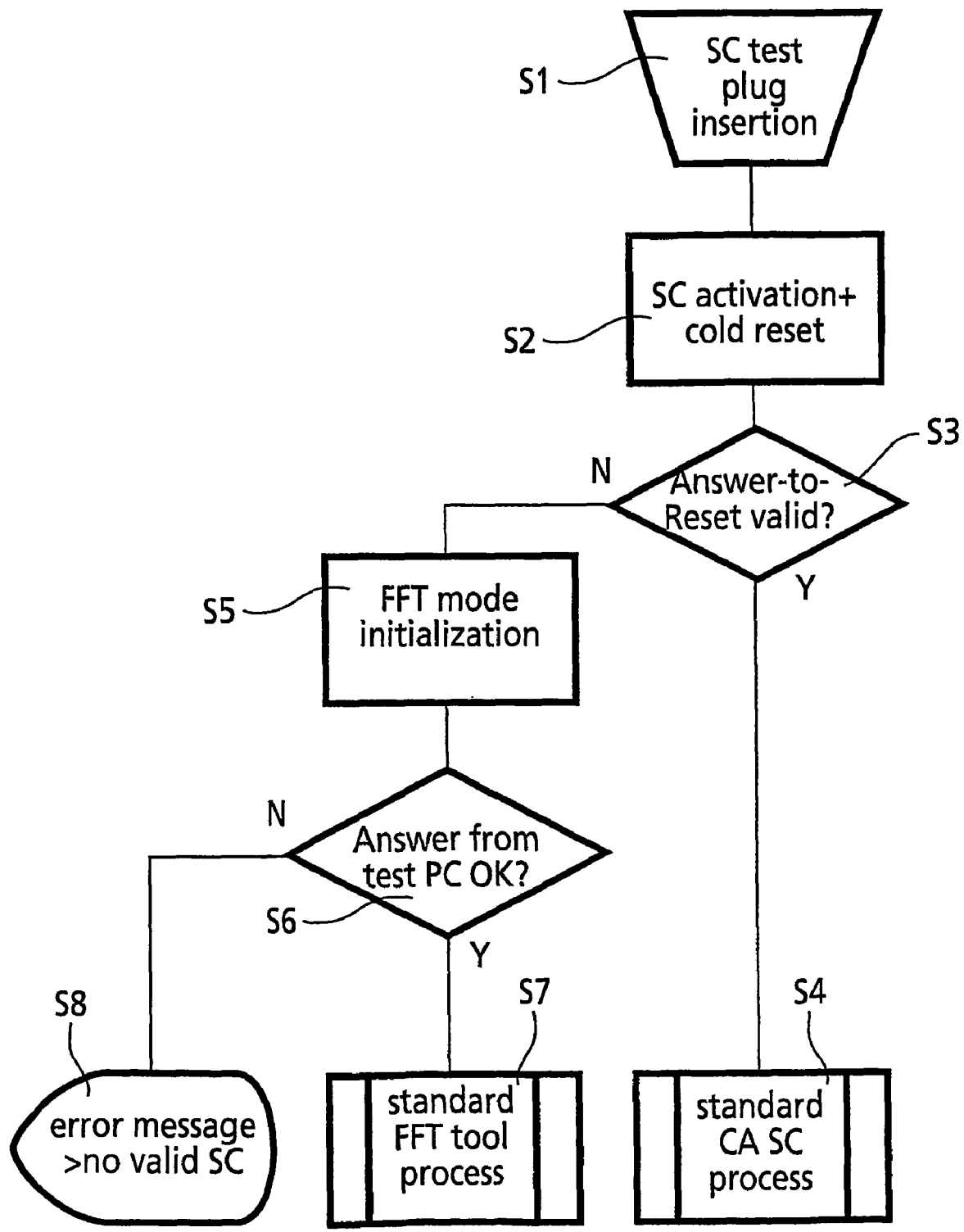

A preferred embodiment of the invention is now explained in more detail with reference to schematic drawings, which show:

FIG. 1 a system with a test adapter for testing a digital set-top box,

FIG. 2 a flow chart showing the method steps for testing of a set-top box, and

Figure 3:
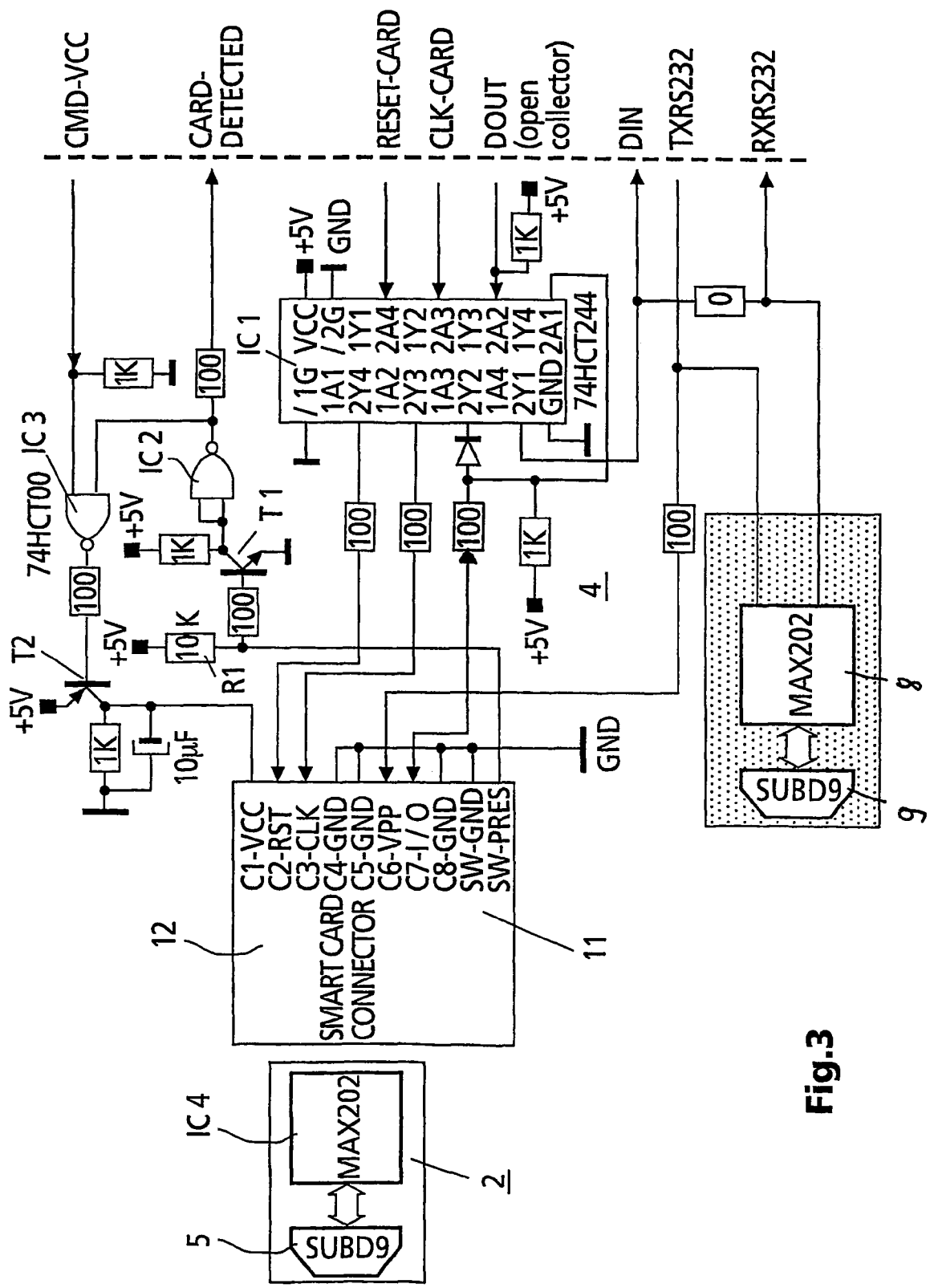

FIG. 3 the smart card reader interface of a digital set-top box, which is suitable for testing with a test adapter.

In FIG. 1 a system is shown for testing a digital set-top box 1 comprising a test adapter 2, which is inserted into a smart card reader 4 of the digital set-top box 1 for testing purposes. The test adapter 2 is coupled to a desktop PC 3, which provides commands via the test adapter 2 to the set-top box 1 and checks the respective responses from the set-top box 1.

The smart card reader 4 complies in this embodiment with the ISO/IEC 7816-3 standard, and the part 6 of the test adapter 2, which is designed for insertion into the smart card reader 4, comprises respective contacts C1–C8 according to this standard. For this purpose the part 6 is made from a printed circuit board having the same thickness and width as a smart card, which is used normally together with the set-top box 1. The smart card reader 4 therefore sees no difference between a smart card and the test adapter 2, when the test adapter 2 is inserted into the smart card reader 4.

On the remaining part 7 of the test adapter 2 a RS232 plug 5 is arranged, also a circuit for providing a conversion of the data signals between the RS232 interface and the signals according to the ISO 7816-3 standard, which are used for the data exchange via the contacts C1–C8 with the smart card reader 4. As a respective circuit, which provides this conversion, an integrated circuit like MAX202 or ST202 may be used.

The test adapter 2 can be coupled therefore via a conventional RS232 cable 10 to the desktop PC 3, the desktop PC 3 having for example a 9-pin male SUB-D connector and the test adapter 2 a 9-pin female SUB-D connector. With the test adapter 2 the set-top box 1 is tested therefore in the same manner as been done before, when using the test adapter 9 arranged at the rear side of the set-top box together with the respective EIA-RS 232 interface 8. Only a few modifications inside the set-top box 1 have to be done, when the test adapter 2 is used for testing, as will be described below together with regard to FIG. 3.

When the plug 9 and the interface 8 are avoided in the set-top box 1, the costs for the set-top box 1 are reduced by about 0.5 Euro. The costs for the test adapter 2 are negligible, because only a few specimens are necessary for testing a complete production in the factory, for performing the Factory Functional Tests. As a test adapter 2 a simple printed circuit board may be used, on which all the parts are arranged, the contacts C1–C8, plug 5, and the respective interface from EIA-RS232 to ISO 7816-3. For the printed circuit board a thickness of 0.8 mm has to be used.

The new method with the test adapter 2 allows therefore an easy testing of all the respective set-top boxes, even for the low-end set-top boxes, because a smart card reader 4 is always implemented. The only disadvantage is, that service personal outside of the factory has no access for testing the set-top box, when they don't have the test adapter 2. But there is still the possibility to provide the set-top box 1 in addition with a RS232 interface 8 and plug 9, to be able to perform tests via the test adapter 2 as well as with the interface 8 and plug 9.

The steps of the new method are now described with reference to a flow chart as shown in FIG. 2. In step S1, the test adapter 2 is inserted into the smart card reader 4 of the set-top box 1. The digital controller of the set-top box 1 assumes then that a smart card has been inserted because the smart card switch 11, see FIG. 1, is actuated. In step S2, the set-top box 1 provides a reset signal for a cold reset for an activation of the assumed smart card.

In step S3, the set-top box 1 waits for an answer to the reset signal of step S2. When a valid smart card has been inserted into the smart card reader 4, the answer to the reset is positive, and then a normal operation with the smart card is starting, step S4, for example the reception and descrambling of a television broadcast, as wanted by a user of the set-top box 1.

If there is no valid answer to the reset signal of step S2, then the set-top box 1 begins with the initialization for a Factory Functional Test (FFT), step S5. The set-top box 1 assumes then, that a test adapter 2 has been inserted into the smart card reader 4. When the set-top box 1 in the next step S6 receives a positive answer from a computer, for example desktop PC 3, the set-top box 1 is ready for the Factory Functional Test, step S7. When the set-top box 1 does not receive a positive signal from a PC, the set-top box 1 displays an error message on it's display: "no valid smart card", step S8.

In FIG. 3 the relevant part of the set-top box 1 for operation with the test adapter 2 is shown. The smart card reader 4 comprises inside the set-top box 1 a smart card connector 12 with contacts C1–C8, for operation with a smart card according to the IEC 7816-3:1997(E) standard. The contacts C1–C8 provide the following connections to a smart card: C1 for supply voltage VCC, C2 for a reset of the smart card, C3 for providing a clock signal to the smart card, C4, C5 and C8 for providing ground terminal connections to the smart card, C6 for providing the programming voltage VPP and C7 for providing a data Input/Output connection for a data exchange between the smart card and the set-top box 1.

The set-top 1 comprises further an integrated circuit IC1, a buffer and line driver for the digital signals used for operation with the smart card, which are in this embodiment the reset signal RST for contact C2, the clock signal CLK for contact C3, and the data input and output signals I/O of contact C7. The integrated circuit IC1 is for example an integrated circuit 74HCT244 from Texas Instruments. For the IC1, also for the smart card and the electronics of the smart card reader 4, a supply voltage of 5 Volts is used.

The smart card reader 4 comprises further switch contacts SW of a switch 11 for a smart card detection, see also FIG. 1. When a smart card, or a test adapter 2, is inserted into the smart card reader 4, the switch contacts SW are open. To one of the switch contacts, PRES, a supply voltage of 5 Volts is coupled via a resistor R1. Also a transistor T1 is coupled with its base terminal to the switch contact PRES, the transistor T1 providing a "low" output signal, when the switch 11 is open, and a "high" output signal, when the switch 11 is closed.

To the transistor T1 a NAND gate IC2 is coupled, arranged as an inverter, for providing a signal "Card-detected" for a micro-controller, not shown, of the set-top box 1. The output of IC2 is also coupled to an input of a NAND circuit IC3, for providing the supply voltage VCC to a smart card, or to the test adapter 2. The other input of the NAND gate IC3 is used for a control signal "Command VCC". Therefore, when a "Card-detected" signal is provided, and also from the micro-controller of the set-top box 1 the signal "Command VCC", the output of IC3 goes to "low", then providing via a transistor T2 the 5 Volts supply voltage VCC to the contact C1 of the card connector 12.

The set-top box 1 may comprise in addition a RS232 interface 8 and a plug 9, see also FIG. 1. As described before, this interface allows to test the set-top box 1, providing especially a Factory Functional Test FFT. This interface provides two signal lines for testing of the set-top box 1, RXRS232 for receive signals and TXRS232 for transmit signals. These lines are coupled to the micro-controller of the set-top box. Therefore, for testing of the set-top box only RX/TX signals are used, and for example the XON/XOFF protocol may be used as a protocol for data exchange, which is well known in telecommunication systems, for example for modem operation.

As described before, the test adapter 2 comprises the same circuitry as the RS232 interface 8, for example an integrated circuit MAX202, IC4. To operate a computer 3 in the same way when connected to plug 5 of the test adapter 2, as has been done before, when the computer 3 is coupled to the plug 9 of the set-top 1, only a few circuit amendments inside the set-top box 1 are necessary. The TXRS232 line has to be connected to contact C6, which is according to the ISO 7816-3 standard the contact for the programming voltage VPP. The contact C6 is therefore used by the test adapter 2 for the transmit signals TXRS232. As a second contact for testing of the set-top box, the contact C7 for data In/Out is used, as has been done already before. This contact C7 is coupled therefore after the buffer integrated circuit IC1 to the contact DIN, for a normal operation of the set-top box 1 together with a smart card, for example descrambling a television signal, and also to the contact RXRS232, for the Factory Functional Test of the set-top box 1.

The set-top box 1 can be tested therefore via the test adapter 2 with a computer 3 in the same way, as has been done before with the RS232 interface 8 and the plug 9. The interface 8 and the plug 9 are therefore no more necessary for a set-top box, which leads to a considerable cost reduction. Of course, interface 8 and plug 9 may be equipped also, as described before, but their use is exclusive with testing through the smart card reader 4.

Therefore, when the test adapter 2 is inserted into the smart card reader 4, the set-top box 1 assumes first, that a smart card has been inserted. The set-top box 1 performs then the respective initialization steps for operation with a smart card according to the ISO/IEC 7816/3 standard. But the test adapter 2 does not provide a respective positive signal after the reset signal, which is applied to contact C2. Then, in a further step the set-top box 1 assumes that a test adapter 2 has been inserted into the smart card reader 4, and it provides then internally the necessary set-up for the test procedures.

Therefore, for the operation of the test adapter 2 only four contacts are necessary: C1, input for voltage VCC, for providing a supply voltage from the smart card reader 4 to the test adapter 2, C7, data I/O output which is used as a serial port to provide data signals to the RXRS232 connection of the set-top box 1, C6, reserved for the programming voltage VPP and to be used as input for signals from the serial port TXRS232, and C8 as a ground input.

The electronics of the test adapter 2 is powered via the contact C1, voltage VCC. The power for the test adapter 2 therefore should not be too high, for example, it should be limited to 50 mA for a supply voltage of 5 Volts.

The software of the set-top box 1 requires therefore only minor changes for working properly with the test adapter 2. Essentially, it has to be avoided, that the set-top box 1 remains in an error mode, when the set-top box 1 recognizes, that not valid smart cart has been inserted into the smart card reader 4. As an alternative, the computer 3 may send a control code after step S3 in which the set-top box 1 waits for an answer to the activation of a smart card, step S2. The control code can be command known to the set-top box 1, which requests the initialization of the set-top box 1 for test procedures. Because the computer 3 uses the same data lines TXRS232 and RXRS232 with the test adapter 2 as with the interface 8, the test programs of the computer 3 have not to be changed.

The printed circuit board of the test adapter 2, which has to be inserted into the smart card reader 4, should have the respective size of a smart card, which is used for normal operation of the set-top box 1. Especially, the thickness of the circuit board should be limited to 0,8 mm and the card contacts C1–C8 have to be arranged according to the ISO/IEC 7816/3 standard, or at least the contacts C1, C6, C7 and C8, to provide the necessary connections between the test adapter 2 and the smart card reader 4. The remaining part of the test adapter 2, which is outside of the smart card reader 4, may be supported at the backside with an additional board, or may be equipped with a housing, to provide the necessary stability for the test adapter 2, when being operated via the cable 10 with a computer 3.

The embodiment as described with regard to FIGS. 1–3 complies with the specification according to ISO/IEC 7816/3, but other applications lie also within the range of the invention. Wireless contacts may be used also by the test adapter 2 and the appliance 1, therefore not requiring a mechanical contacting. The appliance can be integrated also into a television receiver, a personal computer or any other unit. As described before, the test adapter 2 needs only two contacts for providing a supply voltage and ground, and two contacts, one for receiving data signals and one for transmitting data signals. As one of the contacts for data signals therefore an already available contact for input/output signals is used, and as the second contact for data transmission any reserved or unused contact of the smart card connector is used.

The invention claimed is:

1. A method for testing an appliance having a smart card reader, said method comprising steps of:
receiving a test adapter into said smart card reader for testing said appliance, said test adapter having a plurality of contacts that connect to a corresponding plurality of contacts of said smart card reader;
providing a reset signal for an activation of a smart card;
beginning a test mode initialization for testing said appliance via said test adapter if a response to said reset signal is negative; and
using a first one of said contacts of said smart card reader as a serial interface for transmitting signals in accordance with an RS232 standard to test said appliance, wherein said first contact of said smart card reader is not used by said appliance during an operation with said smart card and is a smart card contact for a programming voltage.

2. The method of claim 1, wherein said test adapter is coupled via a cable to a computer, and a second one of said contacts of said smart card reader is used as a second serial interface for transmitting signals between said computer and said appliance via said test adapter when testing said appliance.

3. The method of claim 1, wherein said appliance is a digital set-top box or a digital satellite receiver and said method for testing said appliance is a Factory Functional Test or an aftersales diagnostics test.

4. An appliance, comprising:
a smart card reader having a plurality of contacts, wherein a first one of said contacts which is not used by said appliance during normal operation with a smart card is used as a serial port for testing said appliance; and
wherein said appliance provides a reset signal via a second one of said contacts for an activation of said smart card, and begins a test mode initialization for testing said appliance via a test adapter inserted into said smart card reader if a response to said reset signal is negative.

5. The appliance of claim 4, wherein said first contact is a smart card contact for a programming voltage.

6. The appliance of claim 5, wherein said contacts used for testing said appliance include said first contact, a supply voltage contact, a data In/Out contact and a ground contact.

7. The appliance of claim 6, wherein said data In/Out contact is coupled to a buffer circuit, a DIN contact and a receive contact an RS232 interface.

8. The appliance of claim 4, wherein said appliance is a digital set-top box or a digital satellite receiver and said testing of said appliance includes a Factory Functional Test or an after sales diagnostics test.

9. A method for testing an appliance having a smart card reader, said method comprising steps of:
receiving a test adapter in said smart card reader, said test adapter having a plurality of contacts that connect to a corresponding plurality of contacts of said smart card reader;
providing a reset signal for an activation of a smart card;
beginning a test mode initialization for testing said appliance with a computer via said test adapter if a response to said reset signal is negative; and
using a first one of said contacts of said smart card reader as a serial interface for transmitting signals between said appliance and said computer to test said appliance, wherein said first contact of said smart card reader is not used by said appliance during an operation with said smart card.

10. The method of claim 9, wherein said test adapter is coupled via a cable to said computer, and a second one of said contacts of said smart card reader is used as a second serial interface for transmitting signals between said appliance and said computer via said test adapter when testing said appliance.

* * * * *